(12) United States Patent
Cai et al.

(10) Patent No.: US 10,991,704 B2
(45) Date of Patent: Apr. 27, 2021

(54) MEMORY DEVICE AND A METHOD FOR FORMING THE MEMORY DEVICE

(71) Applicant: GLOBALFOUNDRIES Singapore Pte. Ltd., Singapore (SG)

(72) Inventors: Xinshu Cai, Singapore (SG); Shyue Seng Tan, Singapore (SG); Khee Yong Lim, Singapore (SG); Kiok Boone Elgin Quek, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/233,165

(22) Filed: Dec. 27, 2018

(65) Prior Publication Data

US 2020/0212056 A1    Jul. 2, 2020

(51) Int. Cl.
*H01L 27/11521* (2017.01)
*H01L 27/1156* (2017.01)
*H01L 29/423* (2006.01)
*H01L 27/11546* (2017.01)
*H01L 21/28* (2006.01)

(52) U.S. Cl.
CPC .... *H01L 27/11521* (2013.01); *H01L 27/1156* (2013.01); *H01L 27/11546* (2013.01); *H01L 29/40114* (2019.08); *H01L 29/4234* (2013.01)

(58) Field of Classification Search
CPC ........... H01L 27/11521; H01L 27/1156; H01L 27/11546; H01L 29/40114; H01L 29/4234
USPC ........................................................ 257/315
See application file for complete search history.

(56) References Cited

U.S. PATENT DOCUMENTS

| | | | |
|---|---|---|---|
| 5,242,848 A | 9/1993 | Yeh | |
| 6,133,097 A | 10/2000 | Hsieh et al. | |
| 6,653,188 B1 * | 11/2003 | Huang | H01L 29/40114 438/257 |
| 6,747,310 B2 | 6/2004 | Fan et al. | |
| 6,953,966 B2 * | 10/2005 | Nagata | H01L 21/02164 257/321 |
| 7,250,337 B2 * | 7/2007 | Lee | H01L 29/66833 438/257 |
| 8,617,951 B2 * | 12/2013 | Matsuzaki | H01L 27/115 438/201 |
| 9,653,304 B2 * | 5/2017 | Chiba | H01L 23/528 |
| 10,192,965 B2 * | 1/2019 | Mihara | H01L 21/02233 |
| 2017/0330889 A1 * | 11/2017 | Richter | H01L 27/11531 |

* cited by examiner

*Primary Examiner* — Vu A Vu
(74) *Attorney, Agent, or Firm* — Viering Jentschura & Partner MBB

(57) ABSTRACT

A memory device may include a substrate, a first gate structure, a mask and a second gate structure. The substrate may include a source region and a drain region at least partially arranged within the substrate, and a channel region arranged between the source region and the drain region. The first gate structure may be at least partially arranged over the channel region, and may include a top surface that may be substantially flat. The mask may be at least partially arranged over the top surface of the first gate structure. The second gate structure may be at least partially arranged over the mask and at least partially arranged adjacent to the first gate structure.

23 Claims, 13 Drawing Sheets

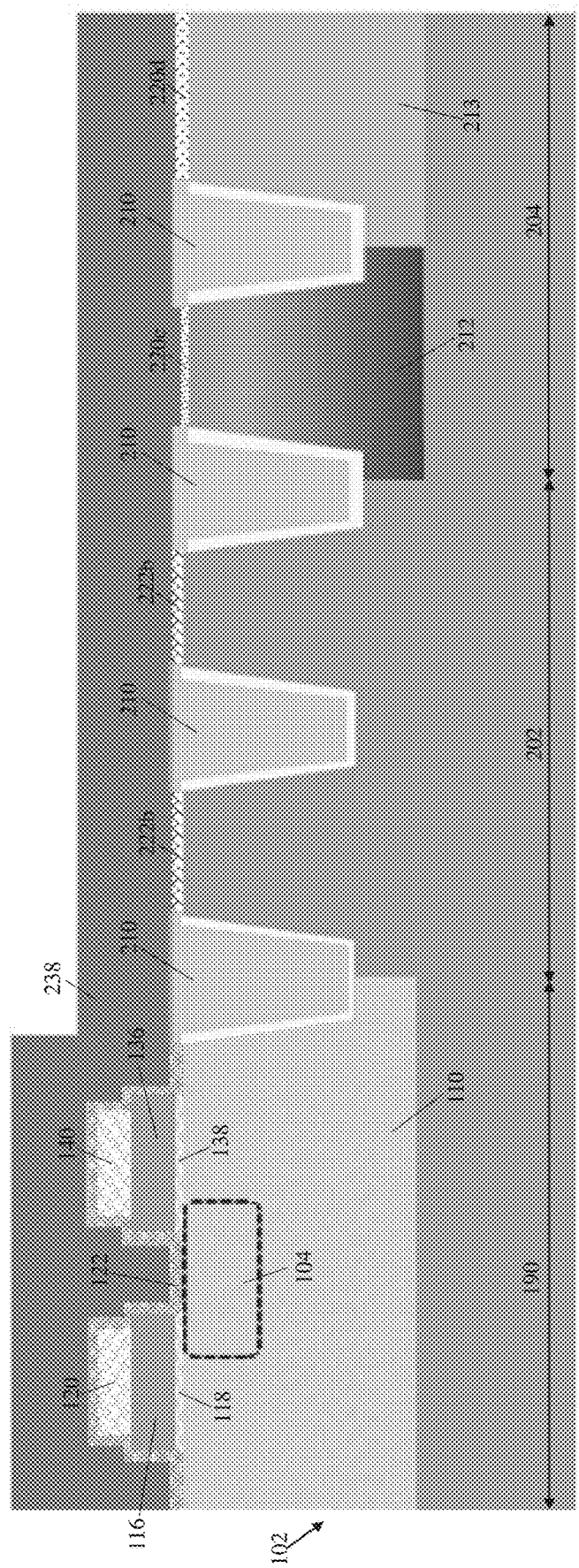

MEMORY DEVICE AND A METHOD FOR FORMING THE MEMORY DEVICE

TECHNICAL FIELD

The present disclosure relates generally to memory devices, methods for forming the memory devices and memory cells including the memory devices.

BACKGROUND

Memory cells including embedded non-volatile memory devices are often used in various consumer electronic products such as smart phones & tablets, and micro control units (MCU). The fabrication of memory cells such as a 1.5 T split gate flash with a control gate and an erase gate is often complicated and expensive. This is usually because of the use of complicated processes for the fabrication of the memory cells. For example, a two-step polysilicon deposition/chemical mechanical polishing (CMP)/etchback process is often used to fabricate the write lines of memory cells. Further, an immersion tool is often used to fabricate the control gates of memory cells. In addition, the fabrication of the memory cells usually involves the use of several masks. The expensive and complicated processes of fabricating memory cells may not be suitable for fabricating memory cells for lower end applications.

Accordingly, it is desirable to provide a memory device that can be fabricated with a simplified process at a lower cost without significantly affecting the performance and size of the memory device.

SUMMARY

According to various non-limiting embodiments, there may be provided a memory device including a substrate including a source region and a drain region at least partially arranged within the substrate, and a channel region arranged between the source region and the drain region; a first gate structure at least partially arranged over the channel region, wherein the first gate structure may include a top surface and wherein the top surface may be substantially flat; a mask at least partially arranged over the top surface of the first gate structure; and a second gate structure at least partially arranged over the mask and at least partially arranged adjacent to the first gate structure.

According to various non-limiting embodiments, there may be provided a method including providing a substrate; forming a first gate structure and a mask, wherein the first gate structure may be at least partially arranged over the channel region and may include a top surface, wherein the top surface may be substantially flat, and wherein the mask may be at least partially arranged over the top surface of the first gate structure; forming a source region at least partially within the substrate; forming a second gate structure at least partially over the mask and at least partially adjacent to the first gate structure; and forming a drain region at least partially within the substrate, wherein a channel region may be arranged between the source region and the drain region.

According to various non-limiting embodiments, there may be provided a memory cell including a plurality of memory devices. Each memory device may include a substrate including a source region and a drain region at least partially arranged within the substrate, and a channel region arranged between the source region and the drain region; a first gate structure at least partially arranged over the channel region, wherein the first gate structure may include a top surface and wherein the top surface may be substantially flat; a mask at least partially arranged over the top surface of the first gate structure; and a second gate structure at least partially arranged over the mask and at least partially arranged adjacent to the first gate structure.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Embodiments of the invention will now be illustrated for the sake of example only with reference to the following drawings, in which:

FIGS. 2A to 2I show cross-sectional views of a non-limiting method for fabricating a semiconductor device including a memory device of the memory cell of FIG. 1A according to a non-limiting embodiment of the present invention.

DETAILED DESCRIPTION

Figure 1A:
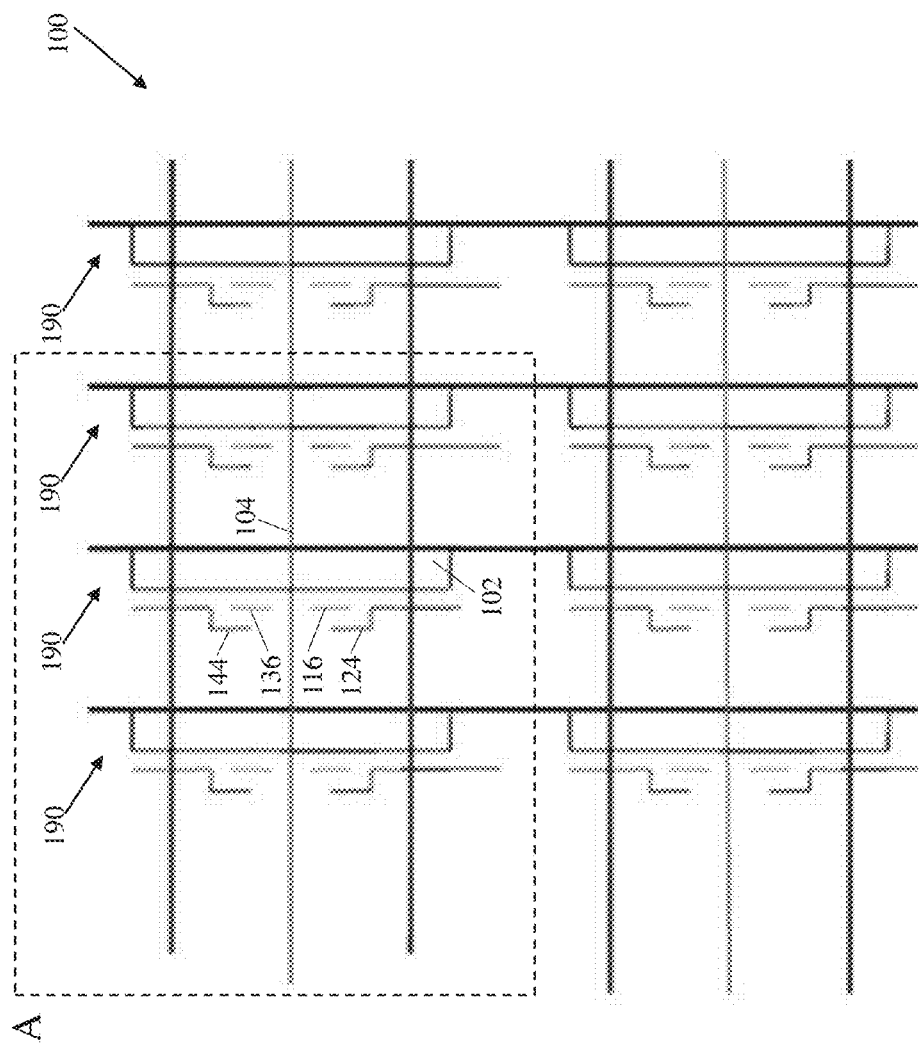
FIG. 1A shows an equivalent circuit of a memory cell according to a non-limiting embodiment of the present invention.

The non-limiting embodiments generally relate to devices, such as semiconductor devices. More particularly, some embodiments relate to memory devices, for example, non-volatile memory devices, such as embedded non-volatile memory devices including multi-time programmable (MTP) memory devices. The memory devices may be used to form memory cells, which may be used in various consumer electronic products such as smart phones and tablets.

According to various non-limiting embodiments, a memory device may include a substrate including a source region and a drain region at least partially arranged within the substrate, and a channel region arranged between the source region and the drain region; a first gate structure at least partially arranged over the channel region, wherein the first gate structure may include a top surface and wherein the top surface may be substantially flat; a mask at least partially arranged over the top surface of the first gate structure; and a second gate structure at least partially arranged over the mask and at least partially arranged adjacent to the first gate structure.

According to various non-limiting embodiments, a method may include providing a substrate; forming a first gate structure and a mask, wherein the first gate structure may be at least partially arranged over the channel region and may include a top surface, wherein the top surface may be substantially flat, and wherein the mask may be at least partially arranged over the top surface of the first gate structure; forming a source region at least partially within the substrate; forming a second gate structure at least partially over the mask and at least partially adjacent to the first gate structure; and forming a drain region at least partially within the substrate, wherein a channel region may be arranged between the source region and the drain region.

According to various non-limiting embodiments, the first gate structure may include a side arranged substantially perpendicular to the top surface to form a tip.

According to various non-limiting embodiments, the first gate structure may include a tip pointing toward the second gate structure and the second gate structure may be at least partially arranged over the first gate structure such that the second gate structure at least partially surrounds the tip of the first gate structure.

According to various non-limiting embodiments, the mask may include a first side adjacent to the second gate structure and a first tip of the top surface of the first gate structure may extend beyond the first side of the mask in a direction toward the second gate structure.

According to various non-limiting embodiments, the mask may include a second side facing away from the second gate structure and a second tip of the top surface of the first gate structure may extend beyond the second side of the mask.

According to various non-limiting embodiments, forming the first gate structure and the mask may include forming a first gate electrode layer over the substrate; forming a mask layer over the first gate electrode layer; and removing portions of the first gate electrode layer and the mask layer.

According to various non-limiting embodiments, forming the first gate structure and the mask may further include smoothing the surface of the first gate electrode layer prior to forming the mask layer.

According to various non-limiting embodiments, the method may further include forming spacers adjacent to the mask and removing the spacers prior to forming the second gate structure.

According to various non-limiting embodiments, the method may further include forming a first part of a logic transistor at least partially within the substrate; and forming the second gate structure may include forming a second gate electrode layer over the substrate; and removing at least a portion of the second gate electrode layer to form the second gate structure and a second part of the logic transistor.

According to various non-limiting embodiments, a memory cell may include a plurality of memory devices. Each memory device may include a substrate including a source region and a drain region at least partially arranged within the substrate, and a channel region arranged between the source region and the drain region; a first gate structure at least partially arranged over the channel region, wherein the first gate structure may include a top surface and wherein the top surface may be substantially flat; a mask at least partially arranged over the top surface of the first gate structure; and a second gate structure at least partially arranged over the mask and at least partially arranged adjacent to the first gate structure.

According to various non-limiting embodiments, for one or more of the memory devices, the first gate structure may include a side arranged substantially perpendicular to the top surface to form a tip.

According to various non-limiting embodiments, for one or more of the memory devices, the first gate structure may include a tip pointing toward the second gate structure and the second gate structure may be at least partially arranged over the first gate structure such that the second gate structure at least partially surrounds the tip of the first gate structure.

According to various non-limiting embodiments, for one or more of the memory devices, the mask may include a first side adjacent to the second gate structure and a first tip of the top surface of the first gate structure may extend beyond the first side of the mask in a direction toward the second gate structure.

According to various non-limiting embodiments, for one or more of the memory devices, the mask may include a second side facing away from the second gate structure and a second tip of the top surface of the first gate structure may extend beyond the second side of the mask.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur-this distinction is captured by the terms "may" and "may be."

Figure 1B:
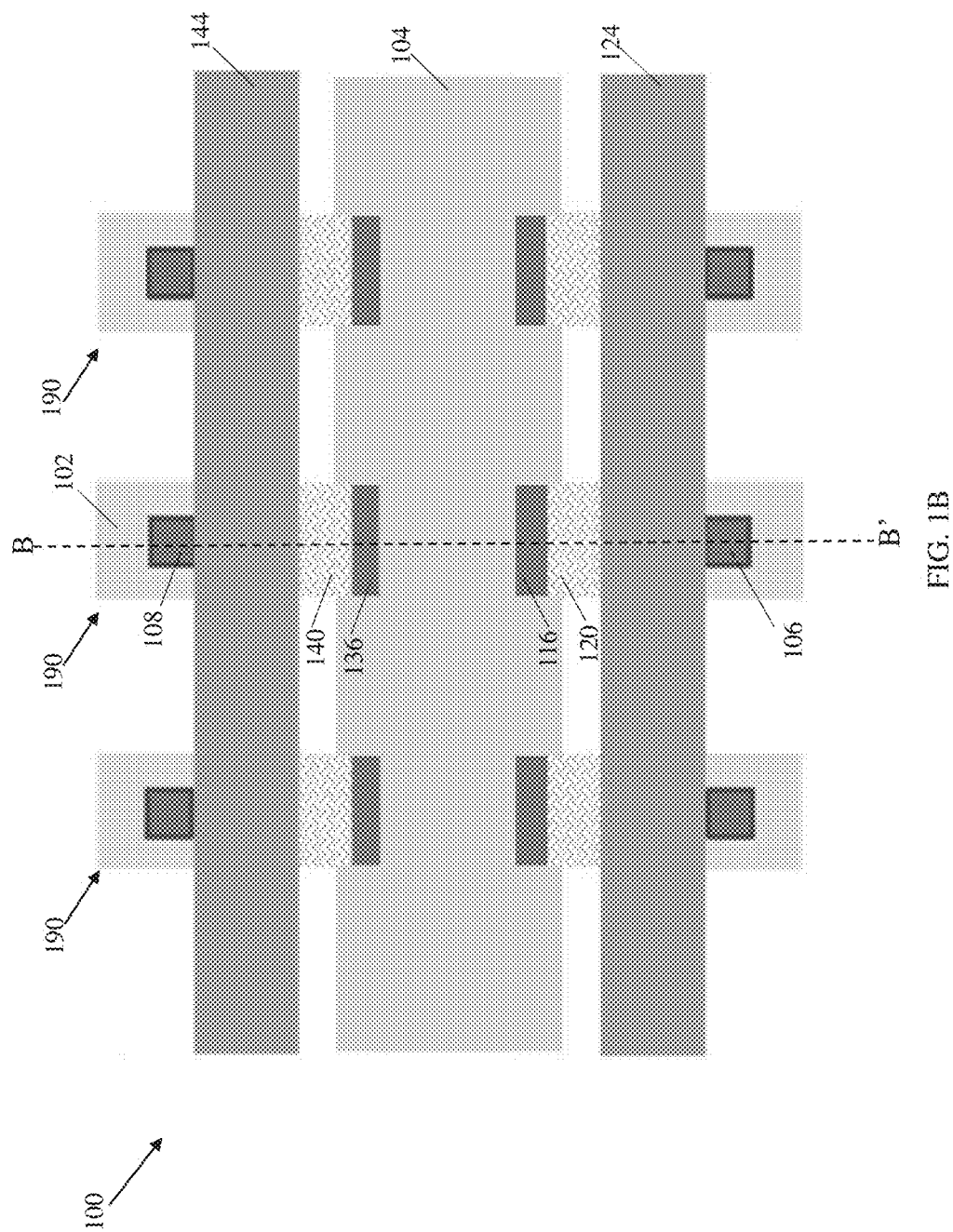
FIG. 1B shows a simplified top view of a portion of the memory cell of FIG. 1A.
Figure 1C:
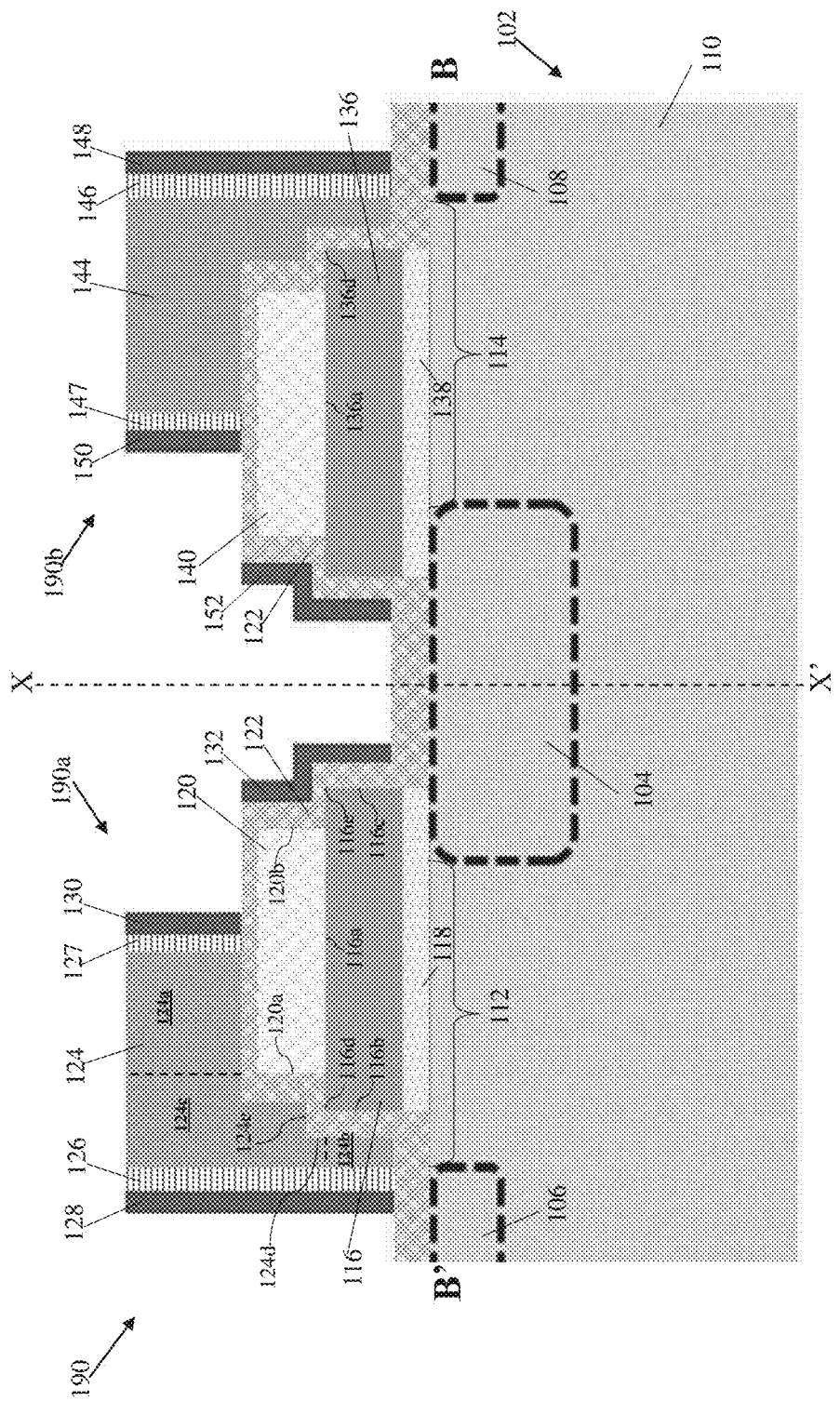
FIG. 1C shows a cross-sectional view of the memory cell of FIG. 1A.
Figure 1D:
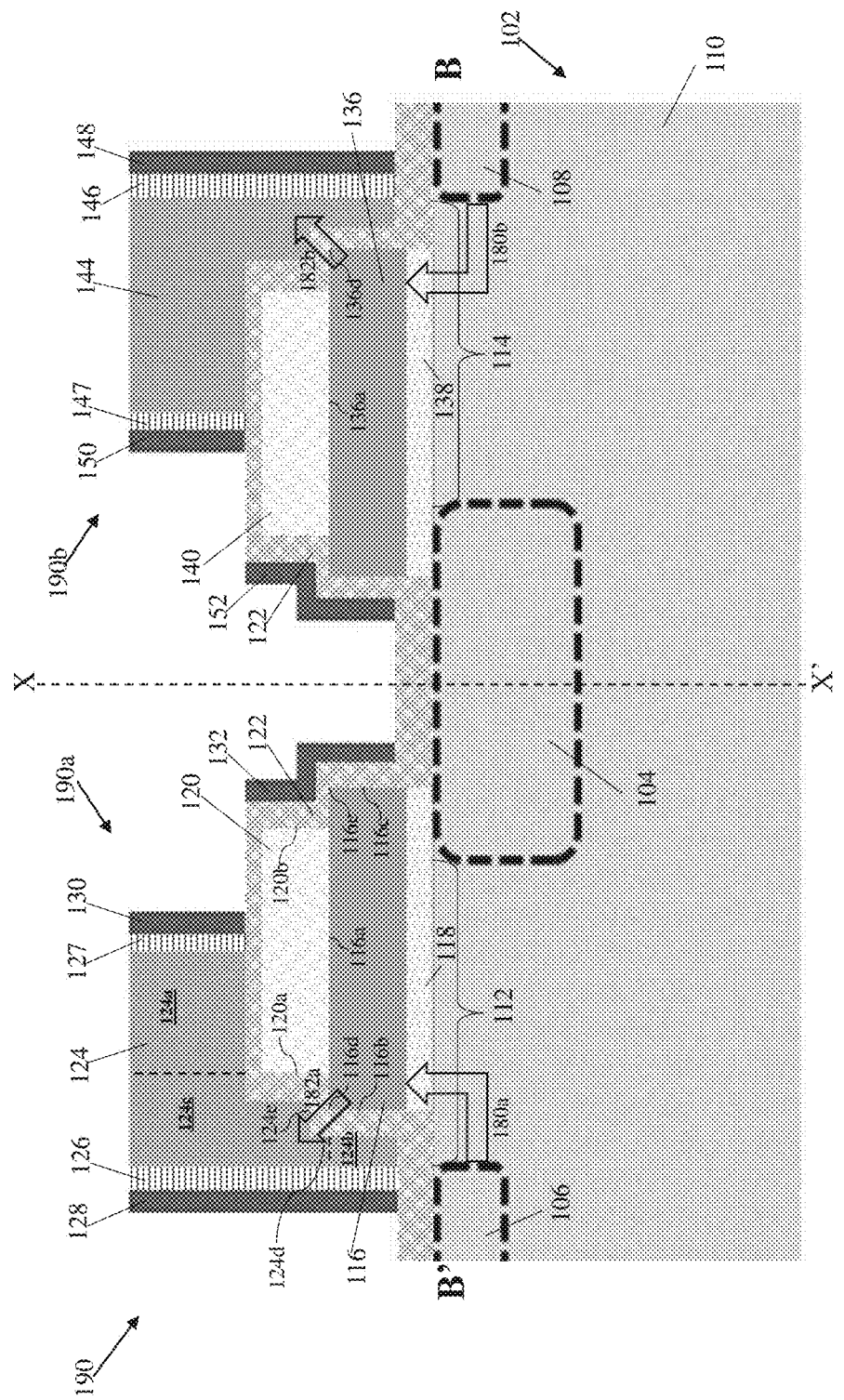
FIG. 1D shows a cross-sectional view of the memory cell of FIG. 1A when the memory cell is in use.

FIG. 1A shows an equivalent circuit of a memory cell 100 according to a non-limiting embodiment of the present invention and FIG. 1B shows a simplified top view of a portion "A" of the memory cell 100. The memory cell 100 may include a plurality of memory devices 190. FIG. 1C shows a cross-sectional view of the memory cell 100 along the line B-B' that includes a memory device 190 according to a non-limiting embodiment of the present invention. FIG. 1D shows the cross-sectional view of FIG. 1C when the memory device 190 is in use. In a non-limiting embodiment, the memory cell 100 may be referred to as a 1.5 T bitcell having a split gate architecture, with each memory device 190 being a non-volatile memory.

The memory device 190 may include a substrate 102. In various non-limiting embodiments, the substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI), silicon germanium substrates, or combinations thereof, and the like. The substrate 102 may in addition or instead include various isolations, dopings, and/or device features. The substrate 102 may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), indium antimonide (InSb), or combinations thereof; an alloy semiconductor including GaAsP, AlInAs, GaInAs, GaInP, GaInAsP, silicon germanium (SiGe), germanium tin (GeSn), silicon germanium tin (SiGeSn), or combinations thereof. Other types of materials as known to those skilled in the art may also be useful for forming the substrate 102.

The substrate 102 may include a source region 104 and a drain region 106 at least partially arranged within the substrate 102, and a channel region 112 arranged between the source region 104 and the drain region 106. The substrate 102 may also include a further drain region 108. A further channel region 114 may be arranged between the source region 104 and the further drain region 108. The remaining portion of the substrate 102 may include a substrate conductivity region 110. Each of the source region 104, drain region 106, further drain region 108 and substrate conductivity region 110 may include one or more dopants. In various non-limiting embodiments, the source region 104, drain region 106 and further drain region 108 may have approximately equal doping concentrations (i.e. approximately equal concentrations of dopants). The doping concentrations of the source region 104, drain region 106 and further drain region 108 may be higher than the doping concentration of the substrate conductivity region 110. In various non-limiting embodiments, the doping concentration of the source region 104 may range from about 1E18 cm$^{-3}$ to about 1E20 cm$^{-3}$, the doping concentration of the drain region 106 may range from about 1E18 cm$^{-3}$ to about 1E20 cm$^{-3}$, the doping concentration of the further drain region 108 may range from about 1E18 cm$^{-3}$ to about 1E20 cm$^{-3}$, and the doping concentration of the substrate conductivity region 110 may range from about 1E15 cm$^{-3}$ to about 1E18 cm$^{-3}$. The source region 104, drain region 106 and further drain region 108 may have a first conductivity type. For example, the source region 104, drain region 106 and further drain region 108 may all have a p-type conductivity, in other words, include dopants having a p-type conductivity (e.g. p-type dopants). Alternatively, the source region 104, drain region 106 and further drain region 108 may all have an n-type conductivity, in other words, include dopants having an n-type conductivity (e.g. n-type dopants). In a non-limiting embodiment, the substrate conductivity region 110 may have a second conductivity type different from the first conductivity type. For example, when the source region 104, drain region 106 and further drain region 108 have a p-type conductivity, the substrate conductivity region 110 may have an n-type conductivity. Alternatively, when the source region 104, drain region 106 and further drain region 108 have an n-type conductivity, the substrate conductivity region 110 may have a p-type conductivity. In one example, the implant material for the source region 104, drain region 106, further drain region 108 and substrate conductivity region 110 may be the same implant material, for example, an epitaxial silicon material in a non-limiting embodiment. The p-type material may be or include, but is not limited to epitaxial silicon germanium and/or the n-type material may be or include, but is not limited to doped silicon material including n-type dopants. P-type dopants can for example, include but are not limited to boron (B), aluminium (Al), indium (In) or a combination thereof, while n-type dopants can include carbon (C), phosphorus (P), arsenic (As), antimony (Sb), or a combination thereof. Other types of implant materials and dopants as known to those skilled in the art may also be useful for forming the source region 104, drain region 106, further drain region 108 and substrate conductivity region 110.

In a non-limiting embodiment as shown in FIG. 1C, the memory device 190 may include a first segment 190a and a second segment 190b arranged over the substrate 102. The first and second segments 190a, 190b may be similar to each other and may be symmetric about an axis X-X' through a center of the memory device 190. However, the memory device 190 need not include both the first and second segments 190a, 190b and in alternative non-limiting embodiments, the memory device 190 may include only the first segment 190a or only the second segment 190b The first segment 190a of the memory device 190 may include a first gate structure 116 at least partially arranged over the channel region 112. For example, the first gate structure 116 may be at least partially arranged over the channel region 112 and partially arranged over the source region 104 as shown in FIG. 1C. A first gate oxide layer 118 may be arranged between the first gate structure 116 and the substrate 102. In a non-limiting embodiment as shown in FIG. 1C, the first gate structure 116 may be arranged over a portion of the channel region 112 but in other alternative non-limiting embodiments, the first gate structure 116 may be arranged over the entire channel region 112. The first gate structure 116 may include a top surface 116a. In various non-limiting embodiments, the top surface 116a of the first gate structure 116 may be substantially flat. In addition, the first gate structure 116 may include a first side 116b arranged substantially perpendicular to the top surface 116a to form a tip (e.g. first tip 116d), and a second side 116c arranged substantially perpendicular to the top surface 116a to form another tip (e.g. second tip 116e).

The first segment 190a may further include a mask 120 and a second gate structure 124 in a non-limiting embodiment. The mask 120 may be at least partially arranged over the top surface 116a of the first gate structure 116. The second gate structure 124 may be at least partially arranged over the mask 120, and may be at least partially arranged adjacent to the first gate structure 116. In a non-limiting embodiment in FIG. 1C, the first gate structure 116 may be arranged over a portion of the channel region 112 and the second gate structure 124 may be at least partially arranged over the channel region 112. For example, the second gate structure 124 may include a first portion 124a arranged over the mask 120, a second portion 124b arranged adjacent to the first gate structure 116 and over the channel region 112, and a third portion 124c joining the first and second portions 124a, 124b. However, in alternative non-limiting embodiments, the first gate structure 116 may be arranged over the entire channel region 112 and the second gate structure 124 may not overlap the channel region 112. The first tip 116d may point toward the second gate structure 124. The second gate structure 124 may be at least partially arranged over the first gate structure 116 such that the second gate structure 124 at least partially surrounds the first tip 116d of the first gate structure 116. For example, referring to FIG. 1C, the second gate structure 124 may include a first edge 124d and a second edge 124e. The first edge 124d and the second edge 124e may be substantially perpendicular to each other and the first tip 116d may be arranged between the two edges 124d, 124e such that the two edges 124d, 124e surround the first tip 116d. The second gate structure 124 may be spaced apart from the first gate structure 116. A spacing between the first gate structure 116 and the second edge 124e of the second gate structure 124 may be approximately equal to a spacing between the first gate structure 116 and the first edge 124d of the second gate structure 124.

In a non-limiting embodiment as shown in FIG. 1C, the top surface 116a of the first gate structure 116 may include at least one tip 116d/116e exposed from the mask 120. For example, the mask 120 may include a first side 120a adjacent to the second gate structure 124 and the first tip 116d of the top surface 116a of the first gate structure 116 may extend beyond the first side 120a of the mask 120 in a direction toward the second gate structure 124. The mask 120 may also include a second side 120b facing away from the second gate structure 124 and the second tip 116e of the top surface 116a of the first gate structure 116 may extend beyond the second side 120b of the mask 120. However, in alternative non-limiting embodiments, at least one side 120a/120b of the mask 120 may be aligned with at least one side 116b/116c of the first gate structure 116. For example, the first side 120a of the mask 120 and the first side 116b of the first gate structure 116 may be aligned (although, having the first tip 116d extending beyond the first side 120a of the mask 120 may improve the erase operation of the memory device 190 in various non-limiting embodiments) and/or the second side 120b of the mask 120 and the second side 116c of the first gate structure 116 may be aligned (whether the second side 120b of the mask 120 is aligned with the second side 116c of the first gate structure 116 may not affect the operation of the memory device 190 since the erase operation may be carried out at the first tip 116d instead of the second tip 116e in various non-limiting embodiments).

The first segment 190a may further include spacers 128, 130, 132. The spacers 128, 130 may be arranged adjacent to the second gate structure 124 such that the second gate structure 124 is between the spacers 128, 130. The spacer 132 may be arranged partially adjacent to the mask 120 and partially adjacent to the first gate structure 116. A first spacer oxide layer 126 may be arranged between the spacer 128 and the second gate structure 124 and a second spacer oxide layer 127 may be arranged between the spacer 130 and the second gate structure 124.

Similar to the first segment 190a, the second segment 190b may include a third gate structure 136, a further mask 140 and a fourth gate structure 144 similar to the first gate structure 116, mask 120 and second gate structure 124, respectively. The arrangement of the third gate structure 136, further mask 140 and fourth gate structure 144 may be symmetrical to the arrangement of the first gate structure 116, mask 120, and second gate structure 124 about the axis X-X'. Further, the first and second segments 190a, 190b may share the same source region 104. The third gate structure 136 may be partially arranged over the further channel region 114 and partially arranged over the source region 104. In a non-limiting embodiment as shown in FIG. 1C, the third gate structure 136 may be arranged over a portion of the further channel region 114 (similar to the arrangement between the first gate structure 116 and the channel region 112) and the fourth gate structure 144 may be arranged in a similar manner as the second gate structure 124 in various non-limiting embodiments. Alternatively, the third gate structure 136 may be arranged over the entire further channel region 114 and the fourth gate structure 144 may not overlap the further channel region 114. Instead, the fourth gate structure 144 may be at least partially arranged over the further mask 140 and at least partially arranged adjacent to the third gate structure 136 and over the further drain region 108. Similar to the first segment 190a, the third gate structure 136 may include a substantially flat top surface 136a and a first tip 136d pointing toward the fourth gate structure 144. The fourth gate structure 144 may be at least partially arranged over the third gate structure 136 such that the fourth gate structure 144 at least partially surrounds the first tip 136d of the third gate structure 136. Further, a second gate oxide layer 138 may be arranged between the third gate structure 136 and the substrate 102. The second segment 190b may also include spacers 148, 150, 152 similar to the spacers 128, 130, 132 of the first segment 190a. The spacers 148, 150 may be arranged adjacent to the fourth gate structure 144 such that the fourth gate structure 144 is between the spacers 148, 150; whereas, the spacer 152 may be arranged partially adjacent to the further mask 140 and partially adjacent to the third gate structure 136. A third spacer oxide layer 146 may be arranged between the spacer 148 and the fourth gate structure 144, and a fourth spacer oxide layer 147 may be arranged between the spacer 150 and the fourth gate structure 144.

A tunnel oxide layer 122 may be arranged over the substrate 102, the first gate structure 116, the mask 120, the third gate structure 136 and the further mask 140, such that the tunnel oxide layer 122 is between the second gate structure 124 and the first gate structure 116, between the second gate structure 124 and the mask 120, between the fourth gate structure 144 and the third gate structure 136, and between the fourth gate structure 144 and the further mask 140. The mask 120 and the first gate structure 116 may be separated from the spacer 132 via the tunnel oxide layer 122. Similarly, the further mask 140 and the third gate structure 136 may be separated from the spacer 152 via the tunnel oxide layer 122. Note that the spacers 128, 130, 132, 148, 150, 152, spacer oxide layers 126, 127, 146, 147 and tunnel oxide layer 122 are not illustrated in FIG. 1A and FIG. 1B for simplicity.

In a non-limiting embodiment, the first and third gate structures 116, 136 may each be referred to as a floating gate (FG), and the second and fourth gate structures 124, 144 may each be referred to as a write line (WL). The source region 104 may be referred to as a source line (SL), and the drain regions 106, 108 may each be referred to as a bit line (BL). The data retention of the memory cell 100 may be approximately 10 years at 125° C. and the endurance of the memory cell 100 may be greater than 10K. The access time of the memory cell 100 may be approximately 30 ns at 0.9V. The program time and erase time of the memory cell 100 may be approximately 10 us and 10 ms, respectively. In a non-limiting embodiment, the memory device 190 may be fabricated using a process simpler than the fabrication process of a prior art 1.5 T split gate flash having a control gate and an erase gate, and in this embodiment, the cell size may range from about 0.08 um$^2$ to about 0.09 um$^2$.

The memory device 190 may operate by using source side injection (SSI) programming and poly-to-poly erasing, and therefore, the performance of the memory device 190 may be comparable to that of prior art memory devices such as a 1.5 T split gate flash with a control gate and an erase gate. For example, as compared to prior art memory devices, the memory device 190 may have similar low voltage (LV)/high voltage (HV) performance and less terminals. Further, the substantially flat top surfaces 116*a*, 136*a* of the first and third gate structures 116, 136 can help reduce the amount of variability, read disturb, reverse tunnelling and susceptibility to retention of electrons in the memory device 190. The masks 120, 140 may facilitate the formation of the first and third gate structures 116, 136 (FGs) during the fabrication process of the memory device 190. For example, the first and third gate structures 116, 136 may be self-aligned to the masks 120, 140 respectively during the fabrication process. Further, the masks 120, 140 may protect the first and third gate structures 116, 136 during the fabrication process after forming the gate structures 116, 136.

FIG. 1D shows the memory device 190 in use in a non-limiting embodiment. FIG. 1D shows the flow of electrons when the source region 104 and the drain regions 106, 108 have an n-type conductivity and when the substrate conductivity region 110 has a p-type conductivity in a non-limiting embodiment. However, it would be clear to a person skilled in the art that the direction of electron flow will change accordingly when the conductivity types of the regions 104, 106, 108, 110 are reversed. Table 1 shows voltages and currents that may be provided to the source region 104 (SL), each of the second and fourth gate structures 124, 144 (WL) and each of the drain regions 106, 108 (BL) of the memory devices 190 to operate the memory cell 100 in the non-limiting embodiment illustrated in FIG. 1D. However, other voltages, currents and durations of providing these voltages and currents may be used in various alternative non-limiting embodiments.

Similarly, because of the low positive voltage of 1.5V provided to the fourth gate structure 144, a weakly inverted channel may be formed in the further channel region 114 between the further drain region 108 (BL) and the source region 104 (SL). By providing a constant current 1 uA to each drain region 106, 108 (BL), electrons may flow from each drain region 106, 108 (BL) to the source region 104 (SL) through the weakly inverted channels in the channel regions 112, 114. Due to the difference in voltages provided to the second gate structure 124 (WL) and the source region 104 (SL) and the difference in voltages provided to the fourth gate structure 144 (WL) and the source region 104 (SL), there may be a steep potential drop along the weakly inverted channels in the channel regions 112, 114. When the electrons flowing through the weakly inverted channels encounter such steep potential drop, the electrons may accelerate and become heated. As a result, some electrons may be injected into each of the first and third gate structures 116, 136 (FG) through the respective gate oxide layer 118, 138, as indicated by the arrows 180*a*, 180*b* in FIG. 1D. The first and third gate structures 116, 136 (FGs) may thus become negatively charged and the selected memory device 190 may be considered to be in state "0". During the programming of the selected memory devices 190, voltages of 0V, 0V, 2.5V may be provided to the SLs, WLs and BLs respectively of the remaining unselected memory devices 190.

To erase selected memory devices 190 of the memory cell 100, a voltage of 0V may be provided to the SL of each selected memory device 190, a voltage of 12V may be provided to each WL of each selected memory device 190 and a voltage of 0V may be provided to each BL of each selected memory device 190 in a non-limiting embodiment. For each selected memory device 190, because of the high voltage difference between the second gate structure 124 (WL) and the first gate structure 116 (FG), electrons may tunnel from the first gate structure 116 (FG) to the second gate structure 124 (WL) as indicated by the arrow 182*a* in FIG. 1D. Similarly, because of the high voltage difference between the fourth gate structure 144 (WL) and the third gate structure 136 (FG), electrons may tunnel from the third gate structure 136 (FG) to the fourth gate structure 144 (WL) as indicated by the arrow 182*b* in FIG. 1D. The first and third gate structures 116, 136 (FGs) may thus become positively charged (or said differently, become discharged of nega-

TABLE 1

| | SL | | WL | | BL | | |
|---|---|---|---|---|---|---|---|
| Operation | Select | Un-Select | Select | Un-Select | Select | Un-Select | Duration |
| Program | 8 V | 0 V | 1.5 V | 0 V | 1 uA | 2.5 V | 10 us |
| Erase | 0 V | 0 V | 12 V | 0 V | 0 V | 0 V | 10 ms |
| Read | 0 V | 0 V | 2.5 V | 0 V | 0.9 V | 0 V | |

Referring to Table 1, in a non-limiting embodiment, to program selected memory devices 190 of the memory cell 100, a voltage of 8V may be provided to the SL of each selected memory device 190, a voltage of 1.5V may be provided to each WL of each selected memory device 190 and a constant current of 1 uA may be provided to each BL of each selected memory device 190 for a duration of approximately 10 us. For each selected memory device 190, because of the low positive voltage level of 1.5V provided to the second gate structure 124 (WL), a weakly inverted channel may be formed in the channel region 112 between the drain region 106 (BL) and the source region 104 (SL).

tively charged electrons) and the selected memory device 190 may be considered to be in state "1". The tunnelling of the electrons may be by the mechanism of Fowler-Nordheim tunnelling. Such tunnelling may be facilitated by locally-enhanced fields on the top surfaces 116*a*, 136*a* of the first gate structures 116, 136. Such locally-enhanced fields may in turn be provided by the first tips 116*d*, 136*d* pointing toward the second and fourth gate structures 124, 144 respectively. During the erasing of the selected memory devices 190, a voltage of 0V may be provided to each of the SLs, WLs and BLs of the remaining unselected memory devices 190.

To read selected memory devices 190 of the memory cell 100, voltages of 0V, 2.5V and 0.9V may be provided to the SLs, WLs and BLs respectively of the selected memory devices 190 in a non-limiting embodiment. For each selected memory device 190, if the first gate structure 116 (FG) is positively charged (in other words, the selected memory device 190 is in state "1"), the portion of the channel region 112 directly beneath the first gate structure 116 (FG) may be turned on. By providing a voltage of 2.5V to the second gate structure 124 (WL), the portion of the channel region 112 directly beneath the second gate structure 124 (WL) may also be turned on. Thus, the entire channel region 112 may be turned on. Similarly, if the third gate structure 136 (FG) is positively charged (in other words, the selected memory device 190 is in state "1"), the portion of the further channel region 114 directly beneath the third gate structure 136 (FG) may be turned on. By providing a voltage of 2.5V to the fourth gate structure 144 (WL), the portion of the further channel region 114 directly beneath the fourth gate structure 144 (WL) may also be turned on. By providing the drain regions 106, 108 with a voltage of 0.9V while keeping the source region 104 at a voltage of 0V, voltage differences between the drain regions 106, 108 and the source region 104 may arise and electrical current may flow between the source region 104 and the drain regions 106, 108 through the channel regions 112, 114. The selected memory device 190 may thus be read as being in the erased state (state "1") when such electrical current is detected. On the other hand, for each selected memory device 190, if the first and third gate structures 116, 136 (FGs) are negatively charged (in other words, the selected memory device 190 is in state "0"), the channel regions 112, 114 beneath the first and third gate structures 116, 136 (FGs) may be weakly turned on or entirely shut off. Therefore, even with the voltage differences between the drain regions 106, 108 and the source region 104, there may be little or no current flowing through the channel regions 112, 114. The selected memory device 190 may thus be read as being in the programmed state (state "0") when little or no electrical current is detected. During the reading of the selected memory devices 190, a voltage of 0V may be provided to each of the SLs, WLs and BLs of the remaining unselected memory devices 190.

In various non-limiting embodiments, the memory cell 100 including the memory devices 190 may be fabricated at a lower cost and with a simpler process using fewer masks, without significantly affecting the performance of the memory cell 100. According to various non-limiting embodiments, a method for fabricating the memory device 190 may include providing the substrate 102; forming the first and third gate structures 116, 136 and the masks 120, 140; forming the source region 104 at least partially within the substrate, forming the second and fourth gate structures 124, 144; and forming the drain regions 106, 108 at least partially within the substrate, with the channel regions 112, 114 arranged between the source region 104 and respective drain regions 106, 108.

FIG. 2A to FIG. 2I show cross-sectional views that illustrate a method for fabricating a semiconductor device including the memory device 190, a high voltage device 202 and a logic transistor 204 according to a non-limiting embodiment. In the method shown in FIG. 2A to FIG. 2I, the memory device 190 is fabricated as part of the semiconductor device. In alternative non-limiting embodiments, the semiconductor device may not include the high voltage device 202 or the logic transistor 204 and/or may include other devices to facilitate the operation of the memory device 190.

Figure 2A:
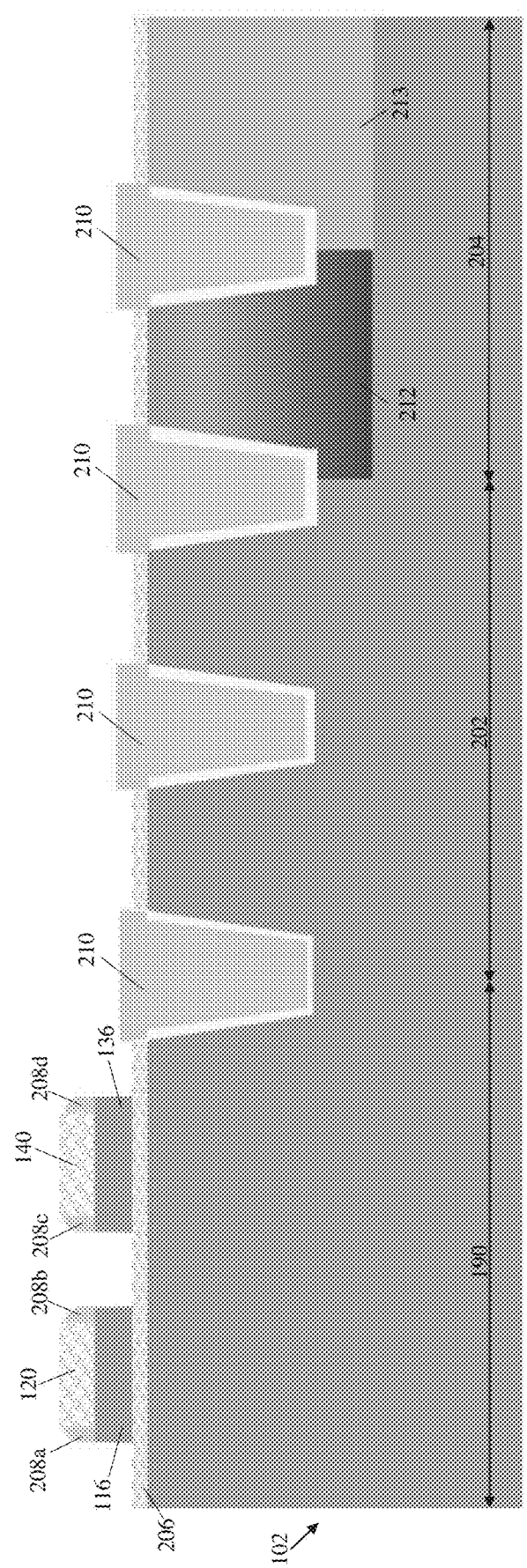

Referring to FIG. 2A, the method may begin by providing the substrate 102. A first oxide layer 206 may be formed over the substrate 102. A first gate electrode layer may be formed over the substrate 102, for example, over the first oxide layer 206 and a mask layer may be formed over the first gate electrode layer. The surface of the first gate electrode layer may be smoothed prior to forming the mask layer. Such smoothing helps form the substantially flat top surfaces 116a, 136a of the first and third gate structures 116, 136. In various non-limiting embodiments, the surface of the first gate electrode layer may be smoothed using chemical mechanical polishing/planarization (CMP) but other techniques as known to those skilled in the art may also be used. Portions of the first gate electrode layer and the mask layer may then be removed to form the first and third gate structures 116, 136 and the masks 120, 140. In various non-limiting embodiments, this removal may be performed by etching the first gate electrode layer and the mask layer using a patterning mask (such as a photoresist mask) but other techniques as known to those skilled in the art may also be used. In various non-limiting embodiments, the first oxide layer 206 may be formed of any gate oxide material known in the art, such as high-k dielectrics or silicon dioxide, the first gate electrode layer may be formed of a conductive material, such as polysilicon, metals or alloys for example TiN, TaN, W or combinations thereof, and the mask layer may include a hard mask layer which may be formed of oxide-nitride-oxide, polysilicon oxide, nitride, or combinations thereof. However, other materials as known to those skilled in the art may also be used. Note that to avoid cluttering the figures, the surfaces 116a-116c, 120a-120b, 136a, portions 124a-124c, edges 124d, 124e, and the tips 116d, 116e, 136d are not labelled in FIG. 2A to FIG. 2I.

Referring to FIG. 2A, the method may further include forming spacers adjacent to the masks 120, 140. For example, a first spacer layer may be formed over the remaining portions of the mask layer and the substrate 102, and then etched to form first spacers 208a, 208b, 208c and 208d as shown in FIG. 2A. The etching of the first spacer layer may be performed using a dry etching technique such as reactive ion etching (RIE) but other techniques as known to those skilled in the art may also be used. The first spacers 208a, 208b may be arranged adjacent to the mask 120 such that the mask 120 is between these first spacers 208a, 208b. Similarly, the first spacers 208c, 208d may be arranged adjacent to the further mask 140 such that the further mask 140 is between these first spacers 208c, 208d. The first spacer layer may include a sacrificial layer formed of silicon oxide, silicon nitride, silicon oxynitride, combinations thereof, or other types of dielectric materials, but other materials as known to those skilled in the art may also be used.

Referring to FIG. 2A, the method may further include forming isolation regions 210 at least partially within the substrate 102. The method may also include forming first and second logic wells 212, 213 of the logic transistor at least partially within the substrate 102. In various non-limiting embodiments, each isolation region 210 may include an isolation material, such as but not limited to a gap fill oxide or nitride, or a combination of both. The logic wells 212, 213 may include one or more dopants and may have a p-type conductivity or an n-type conductivity.

Figure 2B:
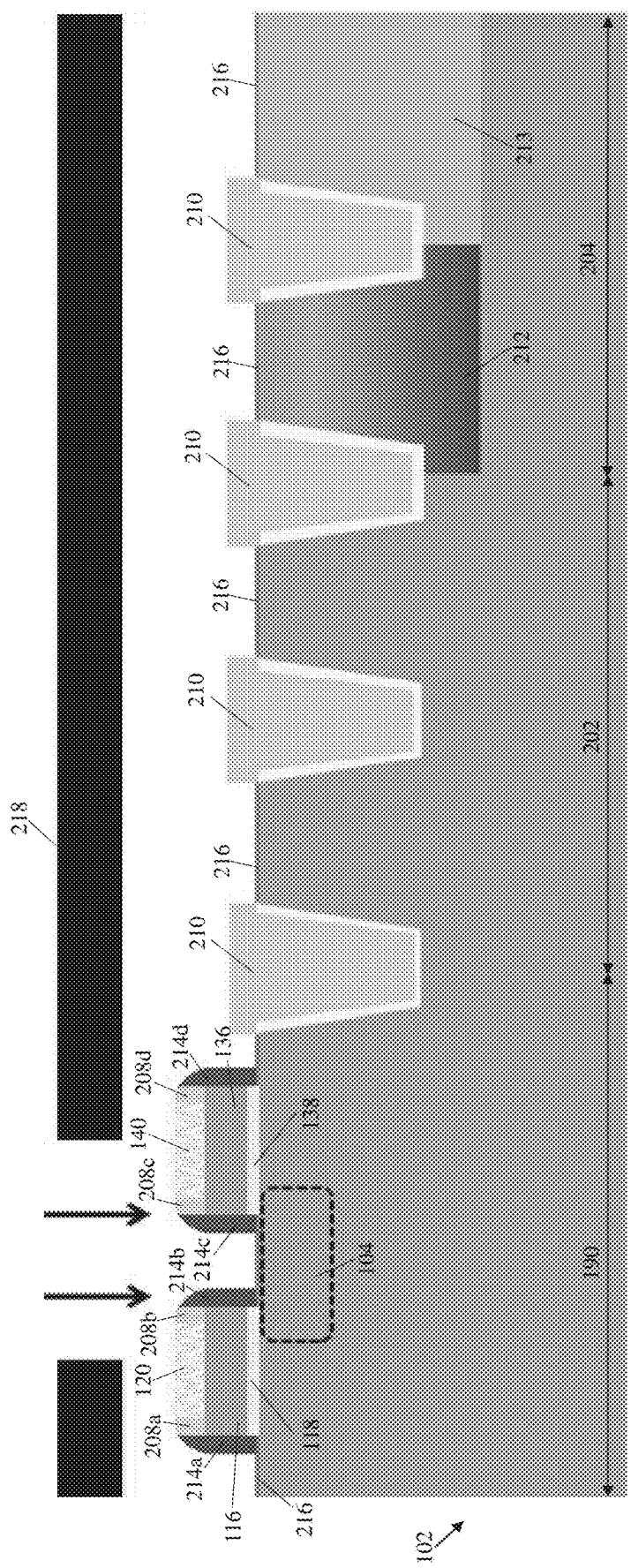

Referring to FIG. 2B, the first oxide layer 206 may be etched to form the gate oxide layers 118, 138 and a second oxide layer 216 may be formed over the substrate 102. A second spacer layer may be formed over the masks 120, 140, first spacers 208a-208d and second oxide layer 216. The second spacer layer may then be etched to form second spacers 214a, 214b, 214c, 214d. The second spacers 214a, 214b may be arranged partially adjacent to the first spacers 208a, 208b and partially adjacent to the first gate structure 116, such that the first spacers 208a, 208b and the first gate structure 116 are between the second spacers 214a, 214b. Similarly, the second spacers 214c, 214d may be arranged partially adjacent to the first spacers 208c, 208d and partially adjacent to the third gate structure 136, such that the first spacers 208c, 208d and the third gate structure 136 are between the second spacers 214c, 214d. The second oxide layer 216 may be formed of any suitable oxide material known in the art, such as but not limited to, high-k dielectrics or silicon dioxide. The second spacer layer may include a sacrificial layer formed of silicon oxide, silicon nitride, silicon oxynitride, combinations thereof, or other types of dielectric materials, but other materials as known to those skilled in the art may also be used.

Referring to FIG. 2B, the method may further include forming the source region 104 at least partially within the substrate 102. In various non-limiting embodiments, the source region 104 may be disposed at least partially within the substrate 102 by ion implantation. For example, referring to FIG. 2B, an implant mask 218 having an opening to expose a region of the substrate 102 intended for the source region 104 may be formed over the substrate 102, and either p-type dopants (when the source region 104 has p-type conductivity) or n-type dopants (when the source region 104 has n-type conductivity) may be introduced into the exposed region of the substrate 102. The implant mask 218 may then be removed. The implant mask 218 may be a photoresist mask in a non-limiting example. Other materials and techniques as known to those skilled in the art may also be useful for forming the source region 104.

Figure 2C:
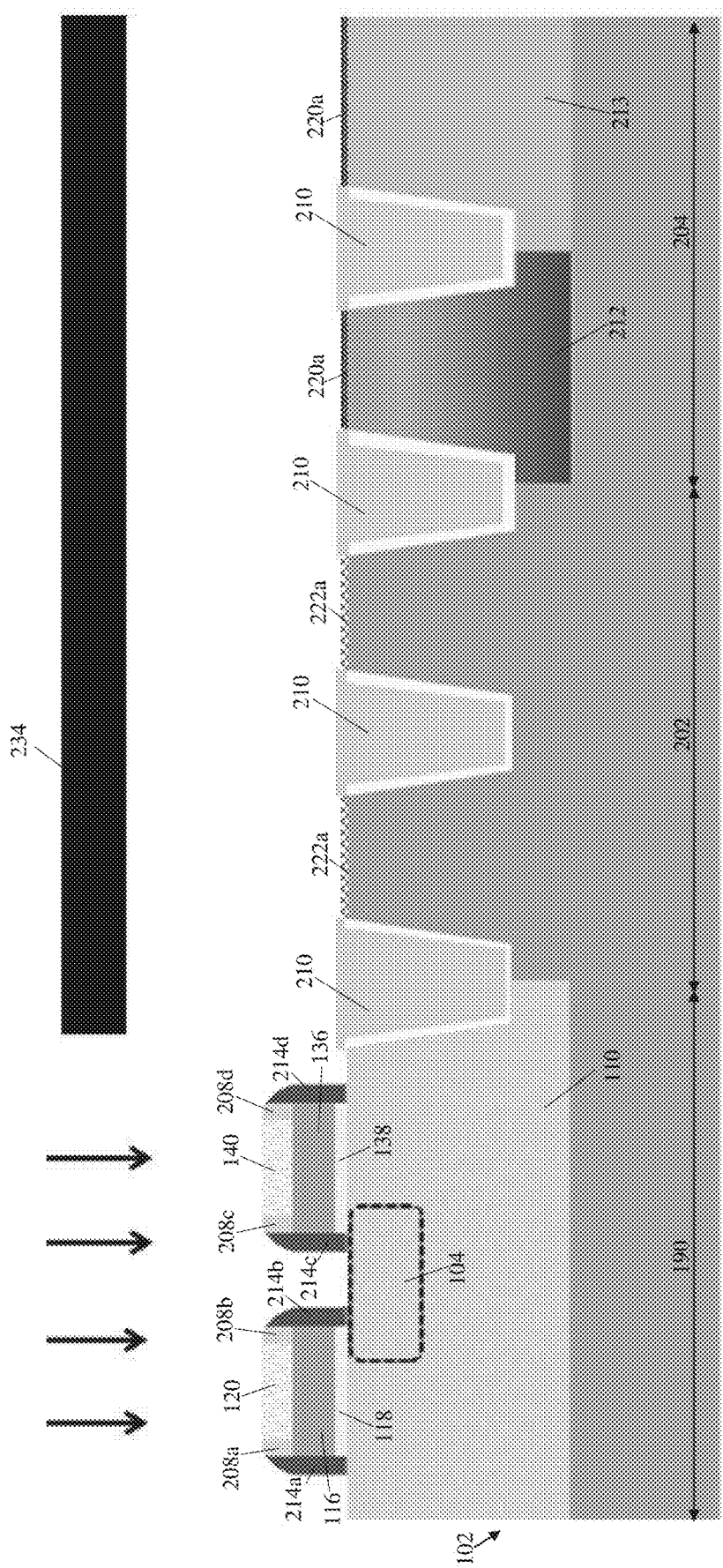

Referring to FIG. 2C, the method may further include removing the portion of the second oxide layer 216 over the region of the substrate intended for the memory device 190. The method may further include forming the substrate conductivity region 110 which may be referred to as a memory well in a non-limiting embodiment. In various non-limiting embodiments, the substrate conductivity region 110 may be formed by ion implantation. For example, as shown in FIG. 2C, an implant mask 234 having an opening to expose the region of the substrate 102 intended for the memory device 190 may be formed over the substrate 102, and either p-type dopants (when the substrate conductivity region 110 has p-type conductivity) or n-type dopants (when the substrate conductivity region 110 has n-type conductivity) may be introduced into the exposed region of the substrate 102. The implant mask 234 may then be removed. Other materials and techniques as known to those skilled in the art may also be useful for forming the substrate conductivity region 110. The method may also include forming a first high voltage device oxide layer 222a and a first logic transistor oxide layer 220a using materials and techniques as known to those skilled in the art.

Figure 2D:
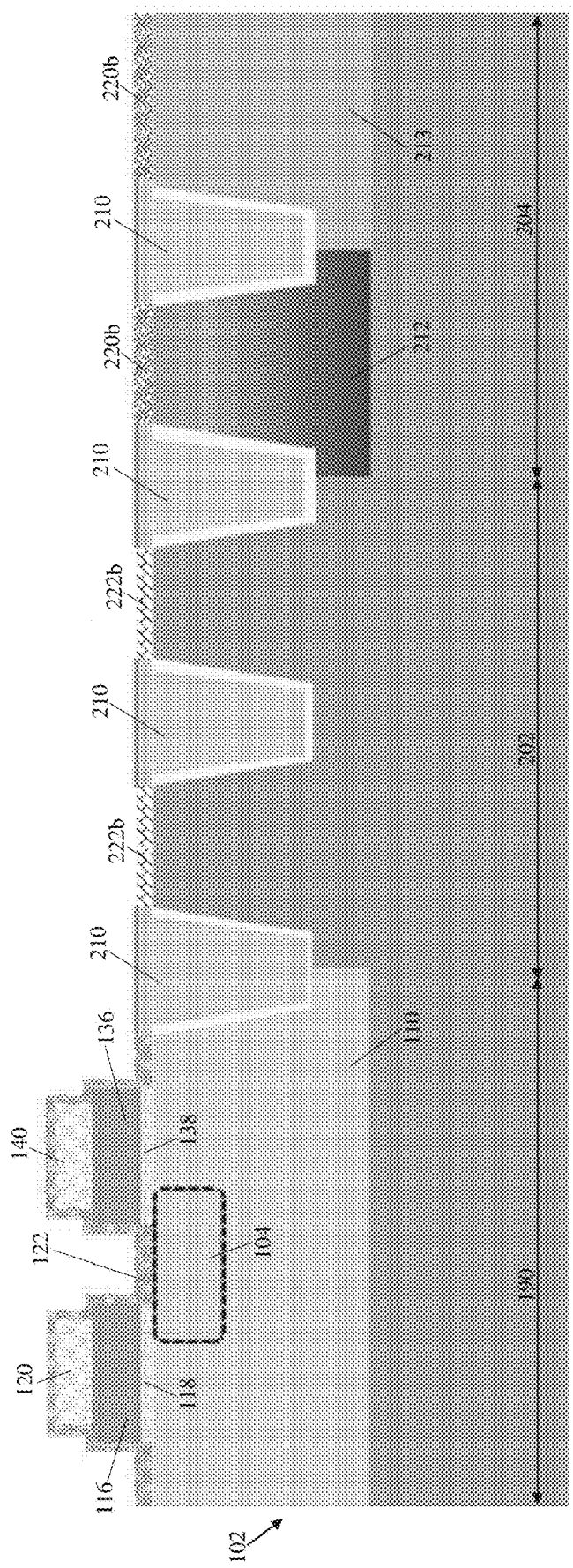

Referring to FIG. 2D, the method may further include removing the spacers including the first and second spacers 208a-208d, 214a-214d. As shown in FIG. 2D, the tunnel oxide layer 122 may then be deposited over the substrate 102, the masks 120, 140 and the first and third gate structures 116, 136. The tunnel oxide layer 122 may be formed of any suitable oxide material known in the art such as, but not limited to, high-k dielectrics or silicon dioxide. After the deposition of the tunnel oxide layer 122, a second high voltage device oxide layer 222b and a second logic transistor oxide layer 220b may be formed.

FIG. 2A to FIG. 2D show the formation of a first part of the logic transistor 204 at least partially within the substrate 102 and the formation of a first part of the high voltage device transistor 202 at least partially within the substrate 102. Referring to FIG. 2E, the method may further include forming the second and fourth gate structures 124, 144, a second part of the logic transistor 204 and a second part of the high voltage device 202. For example, the method may include forming a second gate electrode layer 238 over the substrate 102. The second gate electrode layer 238 may be formed of a conductive material, such as polysilicon, metals or alloys for example TiN, TaN, W or combinations thereof, but other materials as known to those skilled in the art may also be used. Third and fourth logic transistor oxide layers 220c, 220d may be formed over the first and second logic wells 212, 213 respectively using materials and techniques as known to those skilled in the art.

Figure 2F:
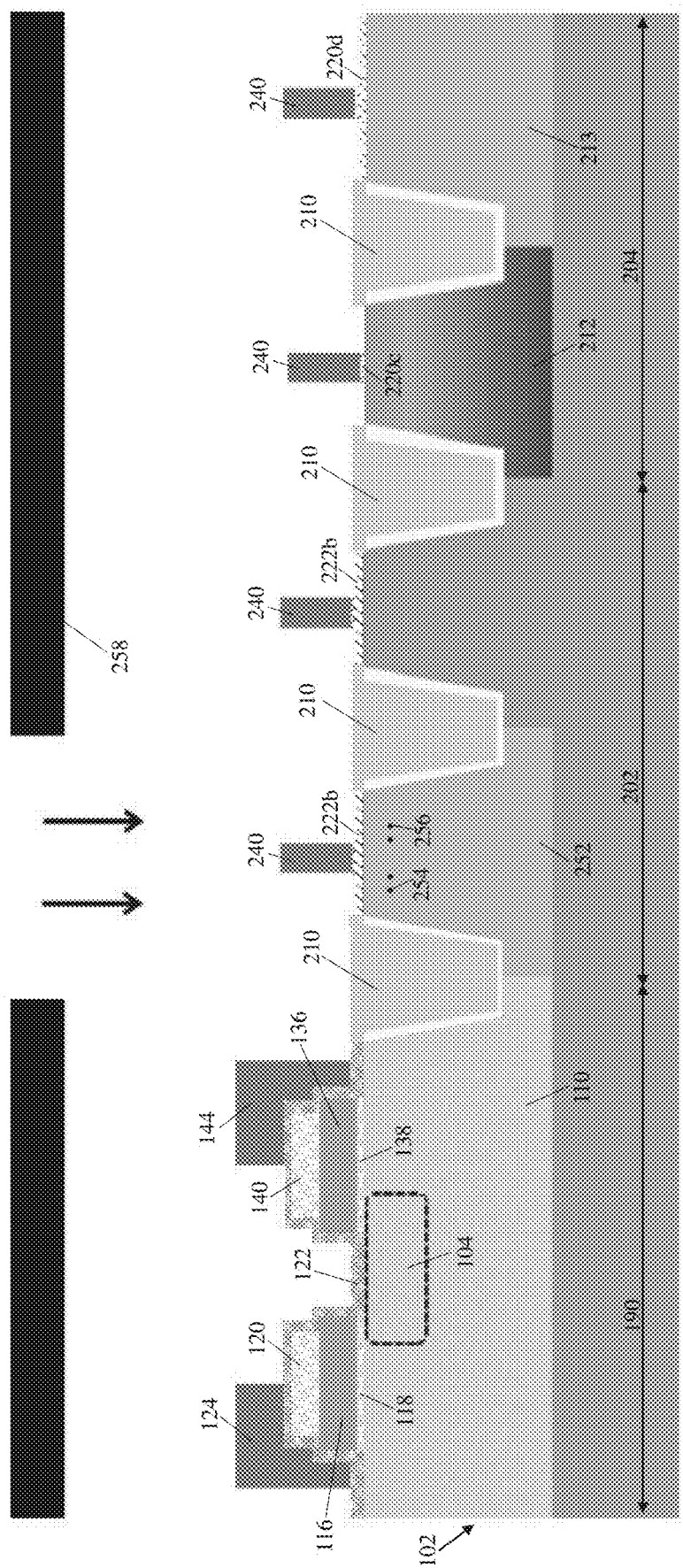

Referring to FIG. 2F, at least a portion of the second gate electrode layer 238 may be removed to form the second and fourth gate structures 124, 144 and the second parts of the logic transistor 204 and the high voltage device 202. The second parts of the logic transistor 204 and the high voltage device 202 may include a plurality of gate structures 240 as shown in FIG. 2F. Removal of portions of the second gate electrode layer 238 may be done by etching the second gate electrode layer 238. This etching may be performed using a dry etching technique such as reactive ion etching (RIE) but other techniques as known to those skilled in the art may also be used. A portion of the exposed part of the second high voltage device oxide layer 222b (in other words, a portion of the part of the second high voltage device oxide layer 222b not under the gate structures 240) may be removed, the entire exposed part of the third logic transistor oxide layer 220c (in other words, the entire part of the third logic transistor oxide layer 220c not under the gate structures 240) may be removed and a portion of the exposed part of the fourth logic transistor oxide layer 220d (in other words, a portion of the part of the fourth logic transistor oxide layer 220d not under the gate structures 240) may be removed.

As shown in FIG. 2A to FIG. 2F, in various non-limiting embodiments, forming first and second spacers 208a-208d, 214a-214d adjacent to the masks 120, 140 and removing them prior to forming the second and fourth gate structures 124, 144 can help expose parts of the first and third gate structures 116, 136. This may in turn help to form the first tips 116d, 136d, such that the first tips 116d, 136d are surrounded by at least part of the second and fourth gate structures 124, 144 respectively.

Figure 2G:
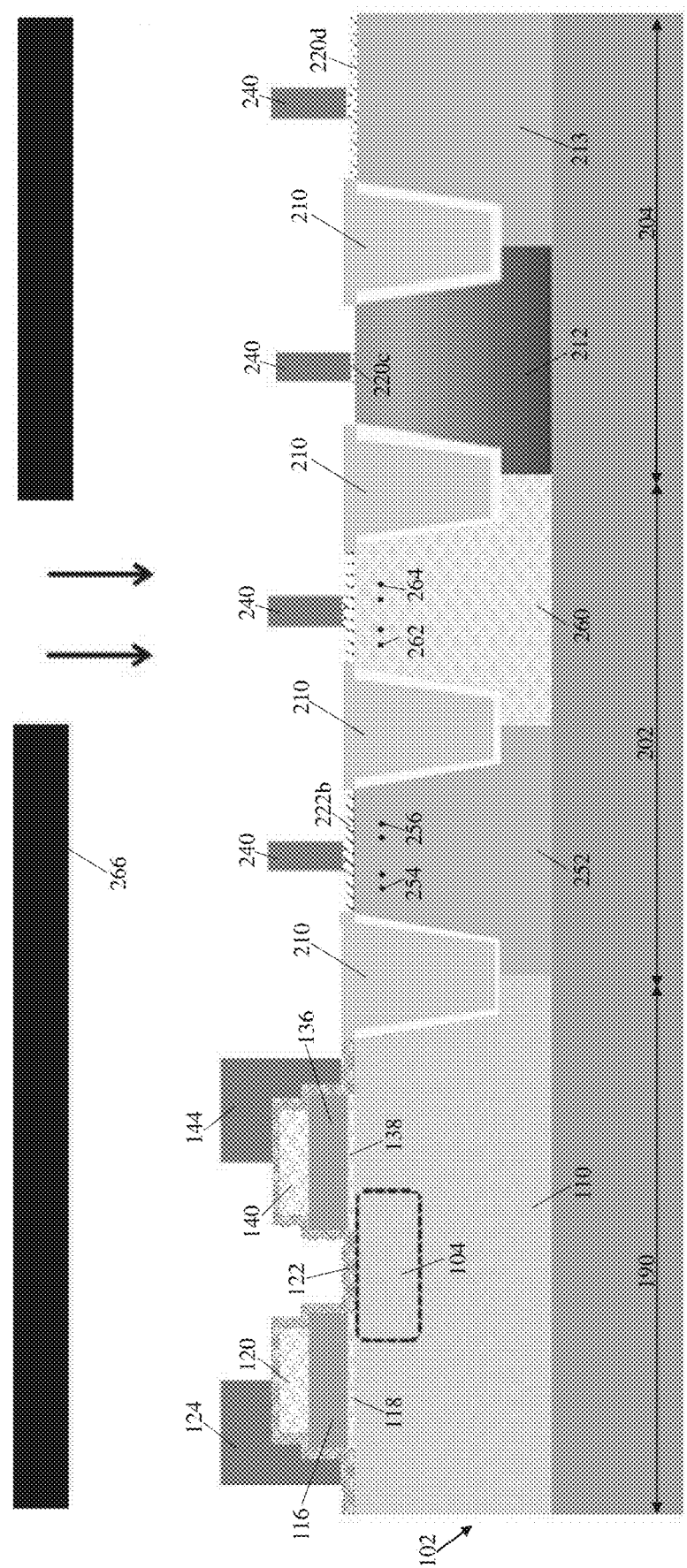

Referring to FIG. 2F and FIG. 2G, a first high voltage well 252 and a second high voltage well 260 may be formed at least partially within the substrate 102. A first high voltage device source region 254 and a first high voltage device drain region 256 may be formed at least partially within the first high voltage well 252 (as shown in FIG. 2F). A second high voltage device source region 262 and a second high voltage device drain region 264 may be formed at least partially within the second high voltage well 260 (as shown in FIG. 2G). These may be formed using materials and techniques as known to those skilled in the art, for example, using masks 258, 266 as shown in FIG. 2F and FIG. 2G.

Figure 2H:
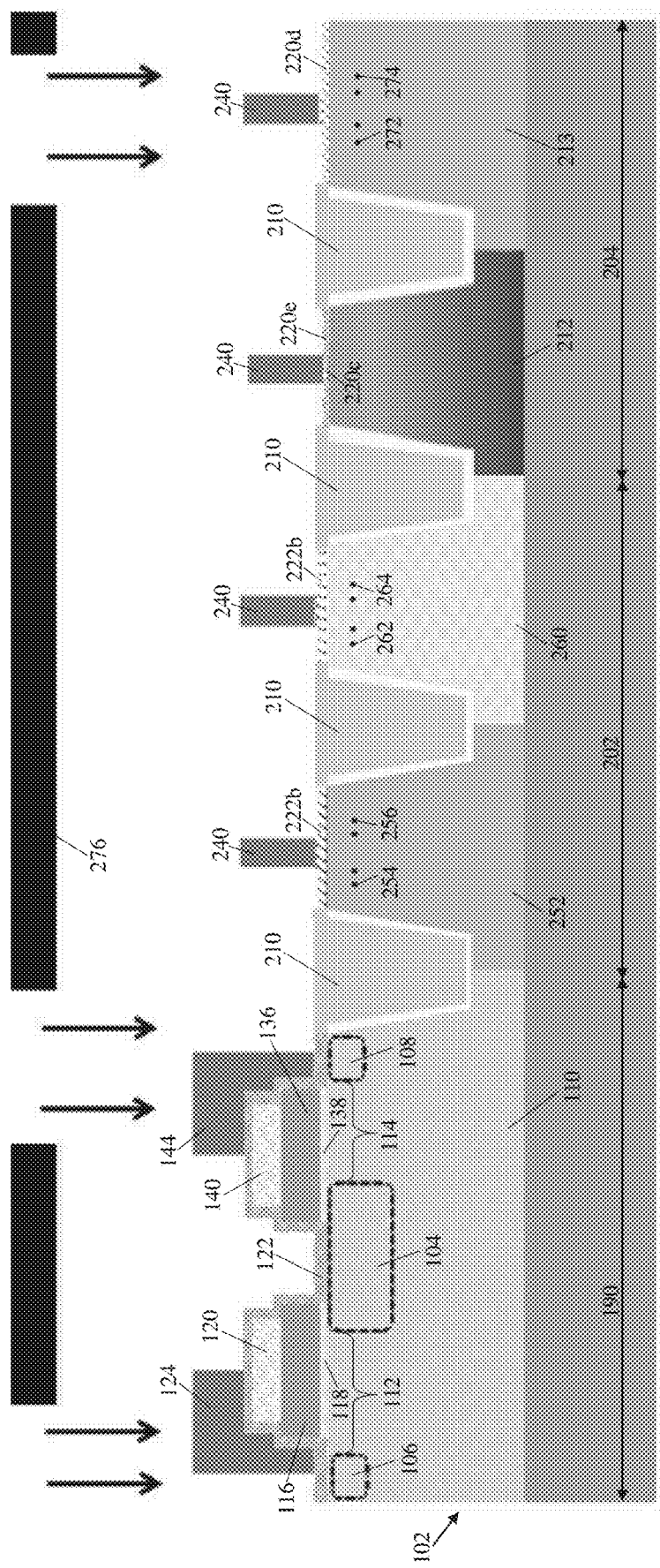

Referring to FIG. 2H, the method may include forming a fifth logic transistor oxide layer 220e over the first logic well 212 of the logic transistor 204 using any material or technique as known to those skilled in the art. The method may also include forming the drain region 106 and further drain region 108 of the memory device 190, and the logic transistor source and drain regions 272, 274. In a non-limiting embodiment, the drain region 106 and the further drain region 108 of the memory device 190 may be formed together with the logic transistor source and drain regions 272, 274. For example, as shown in FIG. 2H, an implant mask 276 (such as, but not limited to, a photoresist mask) having openings to expose regions of the substrate 102 intended for the drain regions 106, 108 of the memory device 190 and the logic transistor source and drain regions 272, 274 may be formed over the substrate 102. Either p-type dopants (when the drain regions 106, 108 of the memory device 190 and the logic transistor source and drain regions 272, 274 have p-type conductivity) or n-type dopants (when the drain regions 106, 108 of the memory device 190 and the logic transistor source and drain regions 272, 274 have n-type conductivity) may be introduced into the exposed regions of the substrate 102. The implant mask 276 may then be removed. Other materials and techniques as known to those skilled in the art may also be useful for forming the drain regions 106, 108 of the memory device 190 and the logic transistor source and drain regions 272, 274. For example, the drain regions 106, 108 of the memory device 190 and the logic transistor source and drain regions 272, 274 need not be formed simultaneously and in alternative non-limiting embodiments, the drain regions 106, 108 of the memory device 190 may be formed before or after the formation of the logic transistor source and drain regions 272, 274.

Figure 2I:
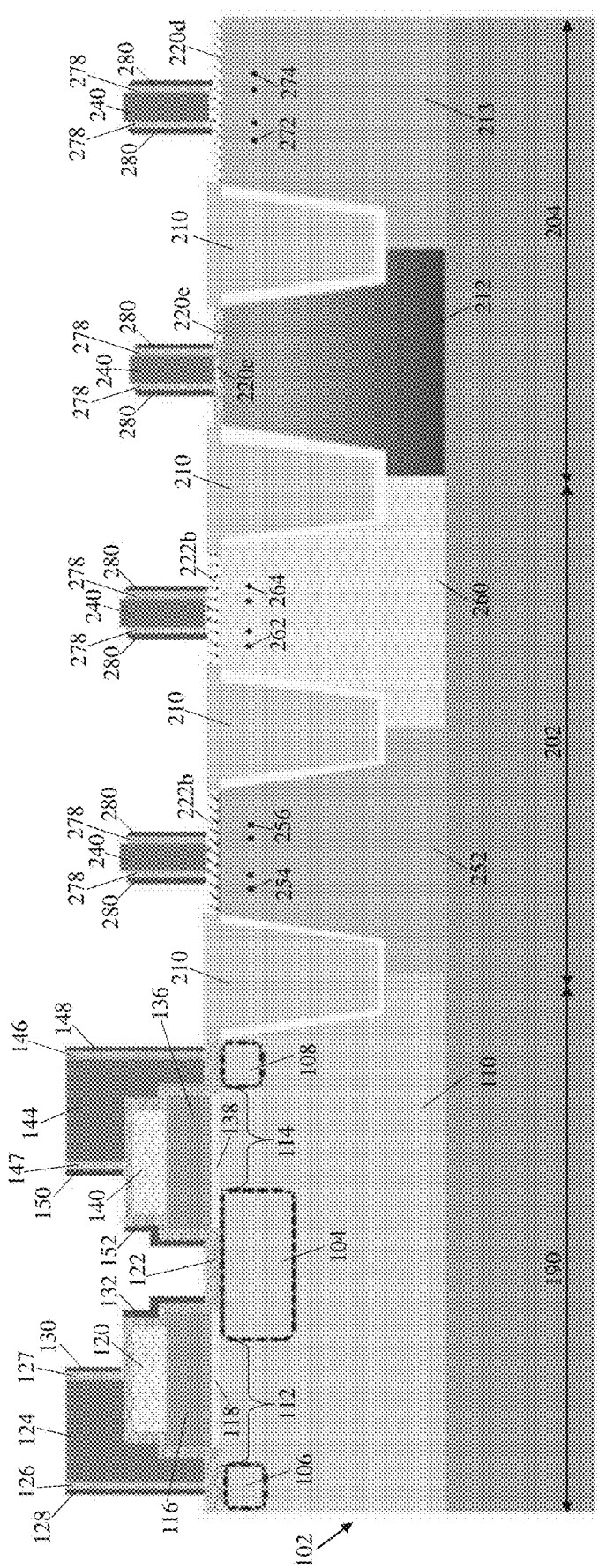

Referring to FIG. 2I, the method may further include forming the first, second, third and fourth spacer oxide layers 126, 127, 146, 147 of the memory device 190, and spacer oxide layers 278 adjacent to the gate structures 240 of the high voltage device 202 and the logic transistor 204. Spacers 128, 130, 132, 148, 150, 152 of the memory device 190 and spacers 280 adjacent to the spacer oxide layers 278 of the high voltage device 202 and the logic transistor 204 may then be formed. In a non-limiting embodiment, the first, second, third and fourth spacer oxide layers 126, 127, 146, 147 of the memory device 190, and spacer oxide layers 278 adjacent to the gate structures 240 of the high voltage device 202 and the logic transistor 204 may be formed by forming a preliminary oxide layer over the substrate 102 and etching the preliminary oxide layer using for example, dry etching. Similarly, the spacers 128, 130, 132, 148, 150, 152 of the memory device 190 and the spacers 280 of the high voltage device 202 and the logic transistor 204 may be formed by forming a spacer layer over the substrate 102 and etching the spacer layer using for example, dry etching. The preliminary oxide layer may be formed of silicon dioxide or other materials as known to those skilled in the art. The spacer layer may be formed of silicon oxide, silicon nitride, silicon oxynitride, combinations thereof, or other types of dielectric materials, or multiple layers of insulating materials. However, other materials and techniques as known to those skilled in the art may also be used. Although not shown in the drawings, in various non-limiting embodiments, the method may further include removing all the oxide layers, except a native oxide layer having a thickness of about 10 Å.

Although not shown in the figures, the method may also further include forming additional conductive lines and contact plugs using for example, a back end of line (BEOL) process as known to those skilled in the art.

The above described order of the steps for the method is only intended to be illustrative, and the steps of the method of the present invention are not limited to the above as a specifically described order, unless otherwise specifically stated.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A memory device comprising:
    a substrate comprising a source region and a drain region at least partially arranged within the substrate, and a channel region arranged between the source region and the drain region;
    a first gate structure at least partially arranged over the channel region, wherein the first gate structure comprises a top surface and wherein the top surface is substantially flat and wherein the first gate structure comprises entirely of electrically conductive material;
    a protecting element at least partially arranged over the top surface of the first gate structure;
    a tunnel oxide layer arranged over the first gate structure and the protecting element, wherein the tunnel oxide layer comprises a portion arranged horizontally beside the protecting element and further arranged to overlap vertically with the substantially flat top surface of the first gate structure; and
    a second gate structure at least partially arranged over the protecting element and at least partially arranged adjacent to the first gate structure.

2. The memory device according to claim 1, wherein the first gate structure comprises a side arranged substantially perpendicular to the top surface to form a tip.

3. The memory device according to claim 1, wherein the protecting element comprises a first side adjacent to the second gate structure and a first tip of the top surface of the first gate structure extends beyond the first side of the protecting element in a direction toward the second gate structure.

4. The memory device according to claim 1, wherein the protecting element comprises a second side facing away from the second gate structure and a second tip of the top surface of the first gate structure extends beyond the second side of the protecting element.

5. The memory device according to claim 2, wherein the second gate structure comprises a first edge and a second edge connected to the first edge, wherein the first edge and the second edge are substantially perpendicular to each other, and wherein the tip of the first gate structure is arranged horizontally beside the first edge of the second gate structure and is further arranged to overlap vertically with the second edge of the second gate structure.

6. The memory device according to claim 1, further comprising a gate oxide layer along a bottom surface of the first gate structure; wherein the gate oxide layer contacts the substrate.

7. The memory device according to claim 5, wherein the second edge of the second gate structure is arranged horizontally beside the protecting element.

8. The memory device according to claim 5, wherein the second gate structure further comprises a third edge and a fourth edge substantially perpendicular to each other;

wherein the third edge of the second gate structure is arranged horizontally beside the protecting element and the fourth edge of the second gate structure is arranged over the protecting element.

9. The memory device according to claim 1,
wherein the protecting element comprises a top surface, a first side and a second side opposite to the first side; and
wherein the tunnel oxide layer is arranged along and substantially parallel to the top surface, the first side and the second side of the protecting element.

10. A method comprising:
providing a substrate;
forming a first gate structure and a protecting element, wherein the first gate structure comprises a top surface and comprises entirely of electrically conductive material, wherein the top surface is substantially flat, and wherein the protecting element is at least partially arranged over the top surface of the first gate structure;
forming a source region at least partially within the substrate;
forming a tunnel oxide layer over the first gate structure and the protecting element, wherein the tunnel oxide layer comprises a portion arranged horizontally beside the protecting element and further arranged to overlap vertically with the substantially flat top surface of the first gate structure;
forming a second gate structure at least partially over the protecting element and at least partially adjacent to the first gate structure; and
forming a drain region at least partially within the substrate, wherein a channel region is arranged between the source region and the drain region, and wherein the first gate structure is at least partially arranged over the channel region.

11. The method according to claim 10, wherein the first gate structure comprises a side arranged substantially perpendicular to the top surface to form a tip.

12. The method according to claim 10, wherein the first gate structure comprises a tip pointing toward the second gate structure and wherein the second gate structure is at least partially arranged over the first gate structure such that the second gate structure at least partially surrounds the tip of the first gate structure.

13. The method according to claim 10, wherein the protecting element comprises a first side adjacent to the second gate structure and a first tip of the top surface of the first gate structure extends beyond the first side of the protecting element in a direction toward the second gate structure.

14. The method according to claim 10, wherein the protecting element comprises a second side facing away from the second gate structure and a second tip of the top surface of the first gate structure extends beyond the second side of the protecting element.

15. The method according to claim 10, wherein forming the first gate structure and the protecting element comprises:
forming a first gate electrode layer over the substrate;
forming a mask layer over the first gate electrode layer; and
removing portions of the first gate electrode layer and the mask layer.

16. The method according to claim 15, wherein forming the first gate structure and the protecting element further comprises smoothing a surface of the first gate electrode layer prior to forming the mask layer.

17. The method according to claim 10, further comprising forming spacers adjacent to the protecting element and removing the spacers prior to forming the second gate structure.

18. The method according to claim 10, further comprising forming a first part of a logic transistor at least partially within the substrate; and wherein forming the second gate structure comprises:
forming a second gate electrode layer over the substrate; and
removing at least a portion of the second gate electrode layer to form the second gate structure and a second part of the logic transistor.

19. A memory cell comprising a plurality of memory devices, wherein each memory device comprises:
a substrate comprising a source region and a drain region at least partially arranged within the substrate, and a channel region arranged between the source region and the drain region;
a first gate structure at least partially arranged over the channel region, wherein the first gate structure comprises a top surface and wherein the top surface is substantially flat and wherein the first gate structure comprises entirely of electrically conductive material;
a protecting element at least partially arranged over the top surface of the first gate structure;
a tunnel oxide layer arranged over the first gate structure and the protecting element, wherein the tunnel oxide layer comprises a portion arranged horizontally beside the protecting element and further arranged to overlap vertically with the substantially flat top surface of the first gate structure; and
a second gate structure at least partially arranged over the protecting element and at least partially arranged adjacent to the first gate structure.

20. The memory cell according to claim 19, wherein for each of the memory devices, the first gate structure comprises a side arranged substantially perpendicular to the top surface to form a tip.

21. The memory cell according to claim 19, wherein for each of the memory devices, the first gate structure comprises a tip pointing toward the second gate structure and wherein the second gate structure is at least partially arranged over the first gate structure such that the second gate structure at least partially surrounds the tip of the first gate structure.

22. The memory cell according to claim 19, wherein for each of the memory devices, the protecting element comprises a first side adjacent to the second gate structure and a first tip of the top surface of the first gate structure extends beyond the first side of the protecting element in a direction toward the second gate structure.

23. The memory cell according to claim 19, wherein for each of the memory devices, the protecting element comprises a second side facing away from the second gate structure and a second tip of the top surface of the first gate structure extends beyond the second side of the protecting element.

* * * * *